United States Patent
Fu et al.

(10) Patent No.: US 9,269,791 B2
(45) Date of Patent: Feb. 23, 2016

(54) MULTI-GATE MOSFET WITH EMBEDDED ISOLATION STRUCTURES

(75) Inventors: Ssu-I Fu, Kaohsiung (TW); En-Chiuan Liou, Tainan (TW); Chih-Wei Yang, Kaohsiung (TW); Ying-Tsung Chen, Kaohsiung (TW); Shih-Hung Tsai, Tainan (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 208 days.

(21) Appl. No.: 13/545,967

(22) Filed: Jul. 10, 2012

(65) Prior Publication Data
US 2014/0015056 A1 Jan. 16, 2014

(51) Int. Cl.
*H01L 27/088* (2006.01)
*H01L 29/66* (2006.01)
*H01L 29/78* (2006.01)
*H01L 21/336* (2006.01)

(52) U.S. Cl.
CPC ........ *H01L 29/66795* (2013.01); *H01L 29/785* (2013.01)

(58) Field of Classification Search
CPC ............... H01L 21/823821; H01L 21/823431; H01L 21/845; H01L 27/0886; H01L 27/0924; H01L 27/1211; H01L 29/41791; H01L 29/66795; H01L 29/785; H01L 2029/785; H01L 21/82; H01L 27/0688; H01L 27/1207; H01L 29/7851

USPC ........................... 257/368, 369; 438/283, 478
See application file for complete search history.

(56) References Cited

U.S. PATENT DOCUMENTS

| | | | |
|---|---|---|---|
| 7,320,908 B2 * | 1/2008 | Son et al. ....................... | 438/175 |
| 2004/0262676 A1* | 12/2004 | Lee et al. ....................... | 257/328 |
| 2005/0019993 A1* | 1/2005 | Lee et al. ....................... | 438/157 |
| 2005/0093082 A1* | 5/2005 | Son et al. ....................... | 257/401 |
| 2006/0084249 A1* | 4/2006 | Yamada ......................... | 438/526 |
| 2007/0045748 A1* | 3/2007 | Booth et al. ................... | 257/369 |
| 2007/0267695 A1* | 11/2007 | Lee ................................ | 257/347 |
| 2007/0281493 A1* | 12/2007 | Fucsko et al. ................. | 438/739 |
| 2008/0073730 A1* | 3/2008 | Lee et al. ....................... | 257/401 |
| 2009/0020792 A1* | 1/2009 | Rios et al. ...................... | 257/288 |
| 2009/0278196 A1* | 11/2009 | Chang et al. .................. | 257/328 |
| 2010/0144121 A1* | 6/2010 | Chang et al. .................. | 438/478 |
| 2012/0299099 A1* | 11/2012 | Huang et al. ................... | 257/347 |
| 2013/0049136 A1* | 2/2013 | Wahl et al. ..................... | 257/401 |
| 2013/0316513 A1* | 11/2013 | Basker et al. ................. | 438/400 |

OTHER PUBLICATIONS

Oxford Dictionaries, "substantially", Oxford Dictionaries, Apr. 2010, Oxford Dictionaries, definition/american_english/.*

* cited by examiner

*Primary Examiner* — Khiem D Nguyen
*Assistant Examiner* — Pauline Vu
(74) *Attorney, Agent, or Firm* — Winston Hsu; Scott Margo

(57) ABSTRACT

A multi-gate MOSFET includes a substrate, a dielectric layer and at least a fin-shaped structure. The substrate has a first area and a second area. The dielectric layer is only located in the substrate of the first area. At least a fin-shaped structure is located on the dielectric layer. Moreover, the present invention also provides a multi-gate MOSFET process forming said multi-gate MOSFET.

7 Claims, 7 Drawing Sheets

MULTI-GATE MOSFET WITH EMBEDDED ISOLATION STRUCTURES

BACKGROUND OF THE INVENTION

1. Field of the Invention

The present invention relates generally to a multi-gate MOSFET and a process thereof, and more specifically to a multi-gate MOSFET and a process thereof, which forms a liner on the sidewalls of a part of the fin-shaped structure, and then oxidizes a part of the fin-shaped structure not covered by the liner and a part of a substrate between each of the fin-shaped structures.

2. Description of the Prior Art

With increasing miniaturization of semiconductor devices, various multi-gate MOSFET devices have been developed. The multi-gate MOSFET is advantageous for the following reasons. First, manufacturing processes of multi-gate MOSFET devices can be integrated into traditional logic device processes, and are therefore more compatible. In addition, since the three-dimensional structure of the multi-gate MOSFET increases the overlapping area between the gate and the substrate, the channel region is controlled more effectively. This therefore reduces drain-induced barrier lowering (DIBL) effects and short channel effects. Moreover, the channel region is longer for a similar gate length. This way, the current between the source and the drain is increased.

In the present semiconductor process, a localized oxidation isolation (LOCOS) or a shallow trench isolation (STI) is normally used to isolate each MOS. However, due to the reduction in both design sizes and fabricating line widths of the semiconductor wafers, pits, crystal defects and longer bird's beak in the LOCOS process will greatly affect the characteristics of the semiconductor wafer. In the same way, the field oxide produced in the LOCOS process occupies a larger volume, which affects the integration of the semiconductor wafer. Thus, in the submicron semiconductor processes, the STI process is widely used as an isolation technique, thanks to its smaller size and improved integration, to isolate each of the multi-gate MOSFET components, especially by forming shallow trench isolation structures between each of fin-shaped structures to electrically isolate them from each other.

Moreover, in nowadays multi-gate MOSFET processes, ion implantation processes and annealing processes may be performed below each fin-shaped structure and the substrate between each of the fin-shaped structures, so as to form channel stop layers with an opposite electrical type below them, in order to electrically isolate transistors formed on each fin-shaped structure. However, the dopants imported during the ion implantation processes are not enough, leading to circuit leakage caused by each of the fin-shaped structures being electrically incompletely isolated.

SUMMARY OF THE INVENTION

The present invention provides a multi-gate MOSFET and a process thereof, which forms a liner on the sidewalls of a part of the fin-shaped structure, and then oxidizes a part of the fin-shaped structure not covered by the liner and a part of a substrate between each of the fin-shaped structures, so that aforesaid problems can be solved.

The present invention provides a multi-gate MOSFET including a substrate, a dielectric layer and at least a fin-shaped structure. The substrate has a first area and a second area. The dielectric layer is only located in the substrate in the first area. The fin-shaped structure is located on the dielectric layer.

The present invention provides a multi-gate MOSFET process including the following steps. At least a fin-shaped structure is formed in a substrate, and a liner is formed on the sidewalls of an upper part of the fin-shaped structure while a lower part of the fin-shaped structure is exposed. An oxidation process is performed to oxidize the exposed lower part.

According to the above, the present invention provides a multi-gate MOSFET and a process thereof, which forms a liner on the sidewalls of a part of the fin-shaped structure, then oxidizes a part of the fin-shaped structure not covered by the liner and a part of a substrate between each of the fin-shaped structures, so that an oxide layer can be formed in the lower part of the fin-shaped structure or below the fin-shaped structure and in the substrate between each of the fin-shaped structures. This way, each of the fin-shaped structures can be electrically isolated from each other, and the substrate and each of the fin-shaped structures can be electrically isolated by oxidizing the lower part of the fin-shaped structures, or the substrate below the fin-shaped structures and the substrate between each of the fin-shaped structures. Therefore, transistors formed on each of the fin-shaped structures can be electrically isolated from each other and circuit leakage downwards to the substrate can be prevented.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
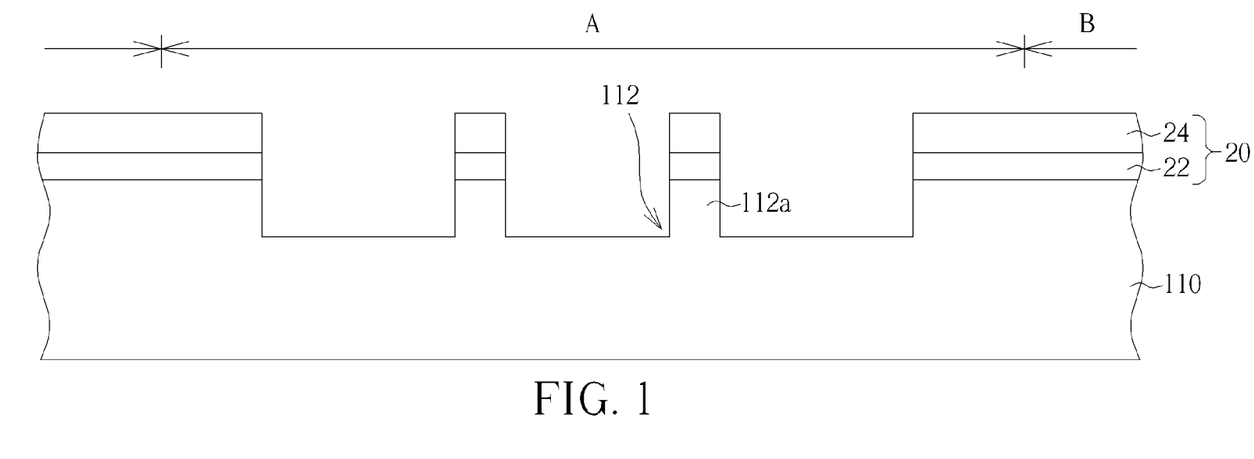
FIGS. 1-7 schematically depict cross-sectional views of a multi-gate MOSFET process according to a first embodiment of the present invention.

FIGS. 1-7 schematically depict cross-sectional views of a multi-gate MOSFET process according to a first embodiment of the present invention. As shown in FIG. 1, a substrate 110 including a first area A and at least a second area B is provided. In a preferred embodiment, the substrate 110 may include a bulk substrate, and the first area A may include a non-planar MOS transistor area and the second area B may include a planar MOS transistor area or a periphery circuit area forming other semiconductor components, but it is not limited thereto. An upper part 112a of at least a fin-shaped structure 112 is formed in the substrate 110 in the first area A. More precisely, a bulk substrate (not shown) is provided, and a hard mask layer 20 is patterned on the bulk substrate (not shown) to define the locations of the fin-shaped structure 112 in the bulk substrate (not shown). The hard mask layer 20 may include a stacked structure of a pad oxide layer 22 and a pad nitride layer 24, but it is not limited thereto. An etching process is performed to form the upper part 112a of each of the fin-shaped structures 112 in the bulk substrate (not shown). This way, the upper part 112a of each of the fin-shaped structures 112 formed in a substrate 110 is completed.

Figure 2:
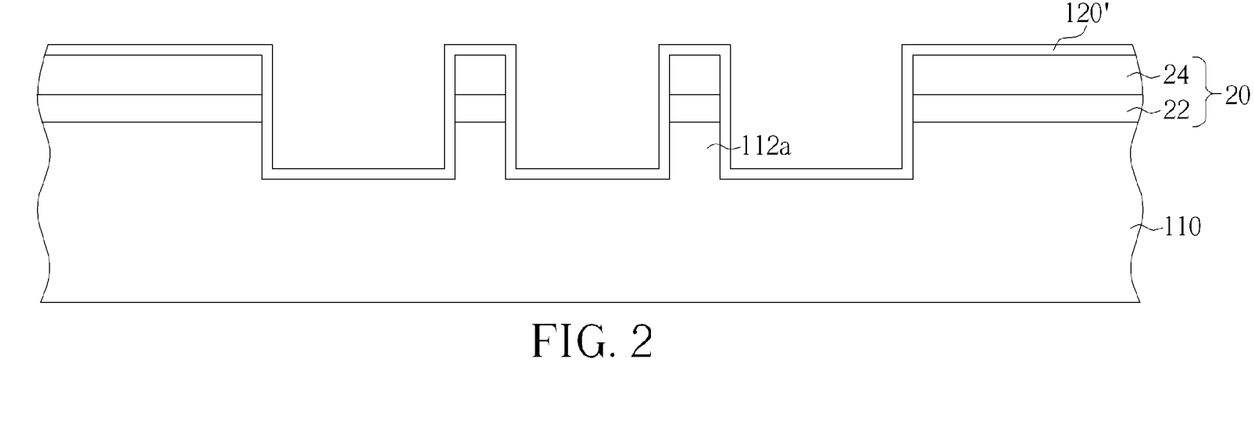
Figure 3:
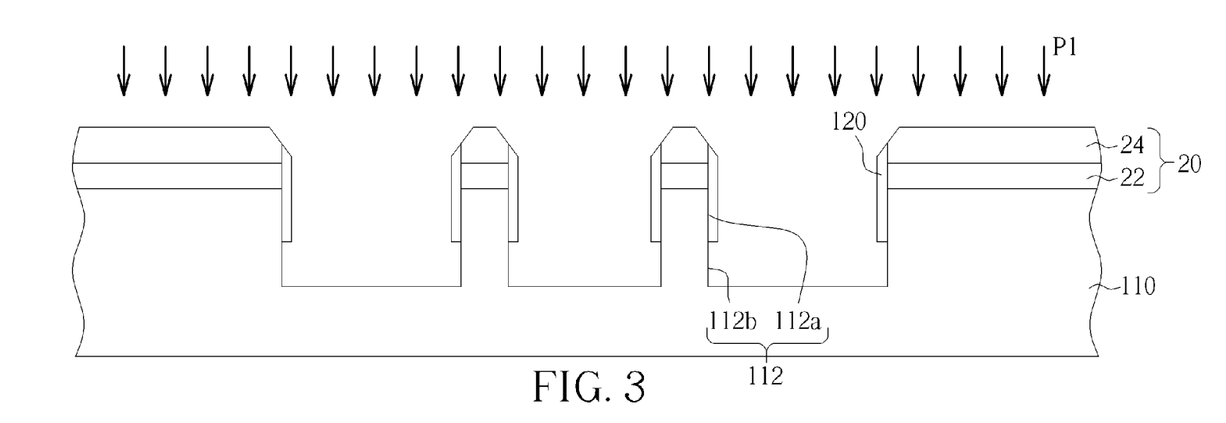

As shown in FIGS. 2-3, a liner 120 is formed on the sidewalls of the upper part 112a of each of the fin-shaped structures 112 while exposing a lower part 112b of each of the fin-shaped structures 112. As shown in FIG. 2, a liner material 120' is formed to entirely cover the upper part 112a of each of the fin-shaped structures 112, the substrate 110 and the hard mask layer 20. In this embodiment, the liner material 120' is a nitride layer. In another embodiment, the liner material 120' may be an antioxidant single layer or an antioxidant multilayer so as to prevent the fin-shaped structures 112 covered by the liner material 120' from being oxidized during later oxidation processes. The antioxidant single layer or the antioxidant multilayer may be silicon oxynitride, amorphous carbide or silicon carbide etc. As shown in FIG. 3, an etching process P1 is performed to remove part of the liner material 120' so that a liner 120 is therefore formed on the sidewalls of the upper part 112a of each of the fin-shaped structures 112 and a lower part 112b of each of the fin-shaped structures 112 is exposed. In this embodiment, the etching process P1 is a dry etching process, which is a non-isotropic etching process, so that fin-shaped structures 112 having vertical sidewalls can be formed, but it is not limited thereto. In another embodiment, a dry etching process may be first performed and then a wet etching process is performed. In this embodiment, the liner 120 and the lower part 112b of the fin-shaped structures 112 can be formed through performing the etching process P1 once. In another embodiment, a plurality of etching processes can be carried out. For example, the liner material 120' is etched firstly to form the liner 120 on the sidewalls of the upper part 112a, and the substrate 110 between each of the upper parts 112a is etched to form the lower part 112b of each of the fin-shaped structures 112. In this embodiment, the materials of the liner 120 and the pad nitride layer 24 are the same, but the thickness of the pad nitride layer 24 is larger than the thickness of the liner 120, so that the pad nitride layer 24 will not be consumed completely when the liner 120 is removed, which would then damage the fin-shaped structures 112 below the pad nitride layer 24, but it is not limited thereto. In another embodiment, the materials of the liner 120 and the pad nitride layer 24 may be different, so they have different etching rates with respect to a specific etching gas/gas combination. By properly designing the thickness ratio of them, the damages of the fin-shaped structures 112 can be avoided by reserving the pad nitride layer 24 after the liner 120 is removed.

Figure 4:
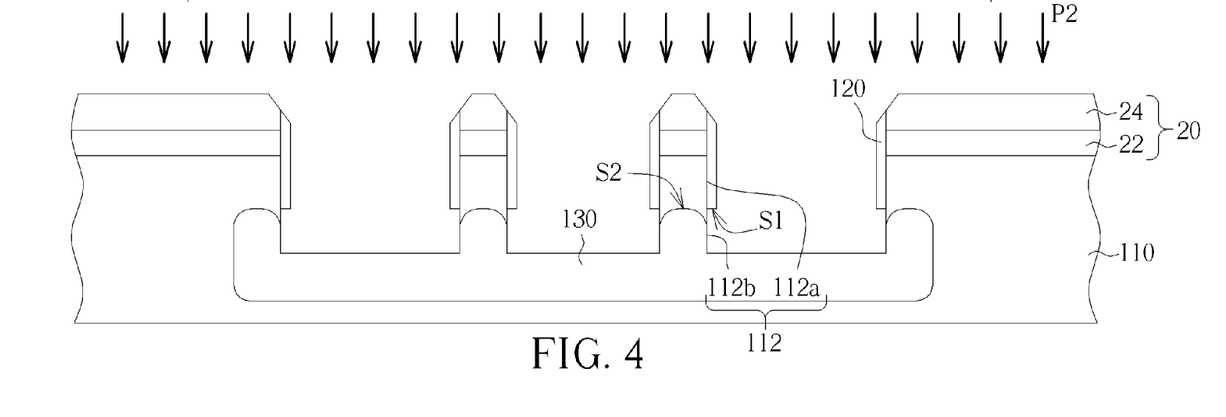

As shown in FIG. 4, an oxidation process P2 is performed to oxidize the lower part 112b of each of the fin-shaped structures 112 and the substrate 110 between each of the fin-shaped structures 112, so that a dielectric layer 130 is formed in the lower part 112b of each of the fin-shaped structures 112 and the substrate 110 between each of the fin-shaped structures 112. In this embodiment, the dielectric layer 130 is formed by performing the oxidation process P2, therefore the dielectric layer 130 is an oxide layer and the oxidation process P2 may be an O2 steam thermal process or a dry thermal oxidation process, but it is not limited thereto. In another embodiment, other isolating processes such as a nitridation process may be performed to form the dielectric layer with other isolation materials such as a nitride layer.

Moreover, the fin-shaped structures 112 or the upper parts 112a of the fin-shaped structures 112 (as the lower parts 112b of the fin-shaped structures 112 are oxidized to be part of the dielectric layer 130) and the substrate 110 sandwich the dielectric layer 130 from top and bottom in first area A, while a whole bulk substrate is in the area B with no dielectric layer nor fin-shaped structures in it. In a preferred embodiment, the oxidation process P2 not only oxidizes the substrate 110 between the fin-shaped structures 112, but also oxidizes the lower part 112b of each of the fin-shaped structures 112. Therefore, the upper part 112a of each of the fin-shaped structures 112 is a silicon structure, and the lower part 112b is a dielectric structure, which is a part of the dielectric layer 130. Furthermore, a plurality of the upper parts 112a of fin-shaped structures 112 may be fully located on the dielectric layer 130, and the dielectric layer 130 is located right below the upper part 112a of each of the fin-shaped structures 112, and on the substrate 110 between the upper part 112a of each of the fin-shaped structures 112. This way, each of the fin-shaped structures 112 can electrically isolate the substrate 110 in the present invention, and each of the fin-shaped structures 112 can electrically isolate with each other, so that transistors formed on the fin-shaped structures 112 can be electrically isolated from each other. Moreover, the dielectric layer 130 is only located in the first area A, and the substrate 110 surrounds the dielectric layer 130. In this way, the dielectric layer 130 of the present invention is only formed in the area A to be used as electrically isolating components in the area A, without affecting components in other areas, such as the second area B.

The liner 120 is located on the sidewalls of a part of the fin-shaped structures 112. In this embodiment, the liner 120 is located on the upper part 112a of each of the fin-shaped structures 112, enabling the lower part 112b of each of the fin-shaped structures 112 being oxidized to form a part of the dielectric layer 130, so that transistors formed on the fin-shaped structures 112 can electrically isolate from the substrate 110. This way circuit leakage flowing downwards can be avoided, but it is not limited thereto. In the present invention, the part of the fin-shaped structures 112 that are not oxidized are covered while the other parts of the fin-shaped structures 112 needing oxidizing are exposed. The oxidation process P2 is then performed to obtain local oxidation. Moreover, since the fin-shaped structures 112 not covered by the liner 120 (such as the lower parts 112b in this embodiment) will be oxidized, the bottom surface S1 of the liner 120 is level with the top surface S2 of the dielectric layer 130, but is not limited thereto.

Figure 5:
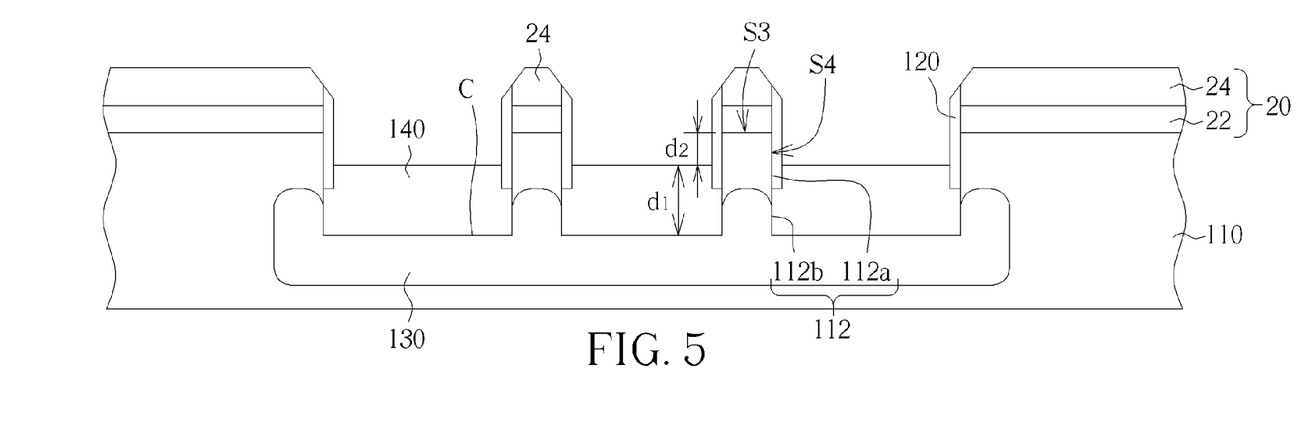

As shown in FIG. 5, an isolation structure 140 is formed on the oxide layer 130 between (or surrounding) the fin-shaped structures 112. In this embodiment, the isolation structure 140 is a shallow trench isolation (STI) structure, which may be formed through a shallow trench isolation (STI) process, but it is not limited thereto. In details, an isolation material (not shown) is formed on the substrate 110 and entirely covers each of the fin-shaped structures 112 and the oxide layer 130. The isolation material (not shown) is planarized to be leveled with the hard mask layer 20. Then, processes such as a dry etching process or a wet etching process are performed to etch back the isolation material (not shown) down to a predetermined depth d1, thereby forming the isolation structure 140. This predetermined depth d1 depends upon the depth d2 of the fin-shaped structures 112 protruding from the isolation structure 140. The depth d2 of the fin-shaped structures 112 is used to form gate structures disposed thereon, wherein a top surface S3 and two sidewalls S4 of each of the fin-shaped structures 112 are used as gate channels. Although the dielectric layer 130 of this embodiment is an oxide layer and the isolation structure 140 is a shallow trench isolation (STI)

structure, which means that the isolation structure 140 is also an oxide layer, there is still an interface C between them because of their different forming methods.

Figure 6:
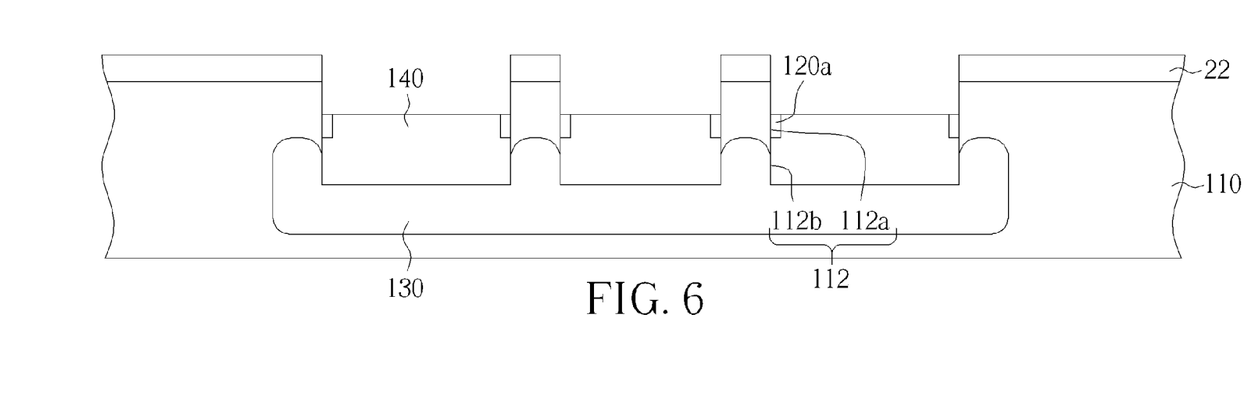
Figure 7:
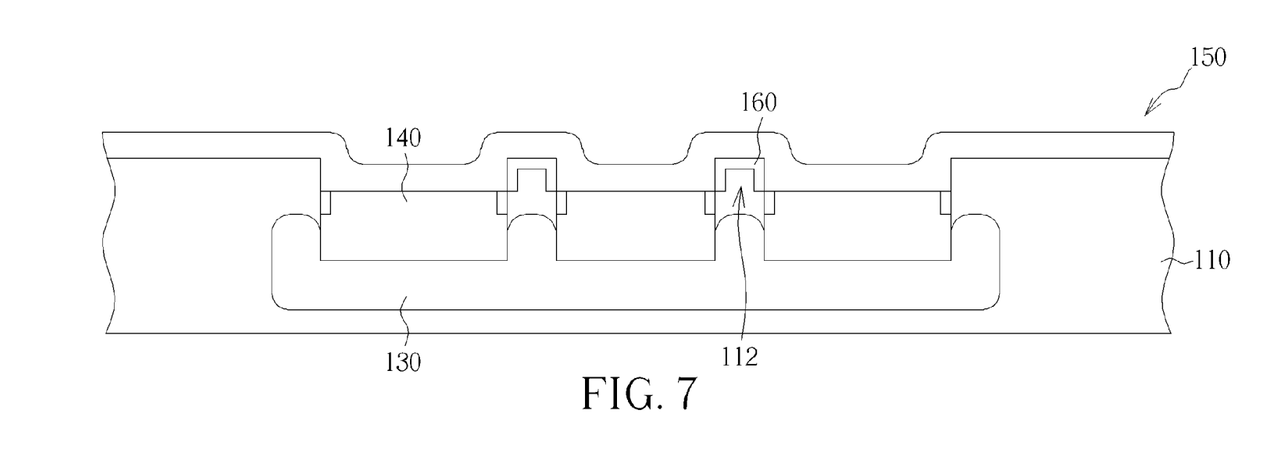

Parts of the liner 120 exposed from the isolation structure 140 and the pad nitride layer 24 of the hard mask 20 are removed, while the liner 120a in the isolation structure 140 is kept as shown in FIG. 6. After the pad oxide layer 22 is removed, a gate structure 150 is formed and disposed on the fin-shaped structures 112 and then a source/drain 160 is formed in the fin-shaped structures 112 beside the gate structure 150 as shown in FIG. 7. In addition, an epitaxial structure (not shown) may be selectively formed on the fin-shaped structures 112, and then the source/drain 160 is formed in the epitaxial structure (not shown), but it is not limited thereto.

The gate structure 150 comprises a stacked structure (not shown), which has a gate dielectric layer and a gate conductive layer. As a metal gate process an example, the gate structure 150 includes a buffer layer, a dielectric layer, a sacrificial gate layer and a cap layer, and a spacer is located on the fin-shaped structures 112 and the substrate 110 beside the stacked structure (not shown). Then, a later multi-gate MOSFET process will be performed. For example, a metal silicide process is performed to form a metal silicide (not shown) on the source/drain 160; a contact etch stop layer (CESL) is formed to cover the substrate; an interdielectric layer (not shown) is formed to cover the entire substrate and planarized. A metal gate replacement process is performed to replace the sacrificial gate layer by a metal gate through applying a gate-last for high-K first process or a gate-last for high-K last process; a metal plug (not shown) is formed in the interdielectric layer (not shown); or etc. These multi-gate MOSFET processes are known in the art, and won't be described herein.

In this embodiment, the hard mask layer 20 is entirely removed, a tri-gate MOSFET can therefore be formed in later processes. There are three contact faces between the fin structure 112 and the following formed dielectric layer functioning as a carrier channel which width is wider than a channel width in conventional planar MOSFETs. When a driving voltage is applied, the tri-gate MOSFET produces a double on-current compared to a conventional planar MOSFET.

In another embodiment, the hard mask layer 20 is reserved to form a fin field effect transistor (Fin FET), which is another kind of multi-gate MOSFET. Due to the hard mask layer 20 being reserved in the fin field effect transistor, there are only two contact faces between the fin structure 112 and the following formed dielectric layer.

Figure 8:
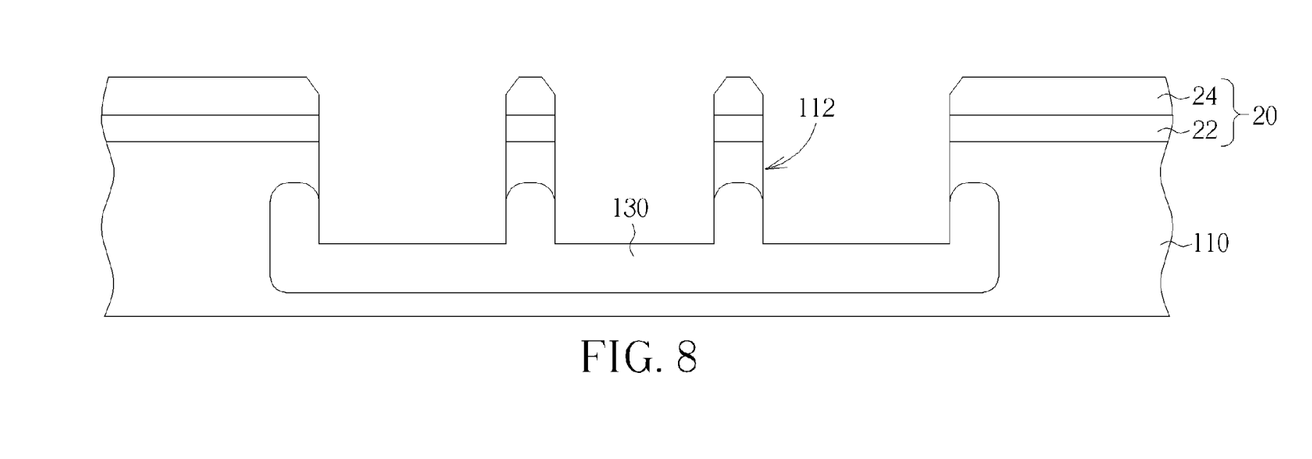
FIG. 8 schematically depicts a cross-sectional view of a multi-gate MOSFET process according to a second embodiment of the present invention.

FIG. 8 schematically depicts a cross-sectional view of a multi-gate MOSFET process according to a second embodiment of the present invention. The first several steps of the second embodiment are the same as the steps of FIGS. 1-4 of the first embodiment. In other words, the steps until forming the dielectric layer 130 in the second embodiment are the same as the ones of the first embodiment. Then, the liner 120 is entirely removed in the second embodiment, thereby exposing the fin-shaped structures 112 as shown in FIG. 8. An isolation structure (not shown) such as a shallow trench isolation (STI) structure may be selectively formed. Due to the dielectric layer 130 electrically isolating each of the fin structures 112 whether forming the isolation structure (not shown) or not, the depth of the isolation structure (not shown) depends upon the thickness of the gate structure disposed across the fin structures 112. Other multi-gate MOSFET processes, such as forming the gate structure, are similar to processes of the first embodiment, and will not be described herein.

Figure 9:
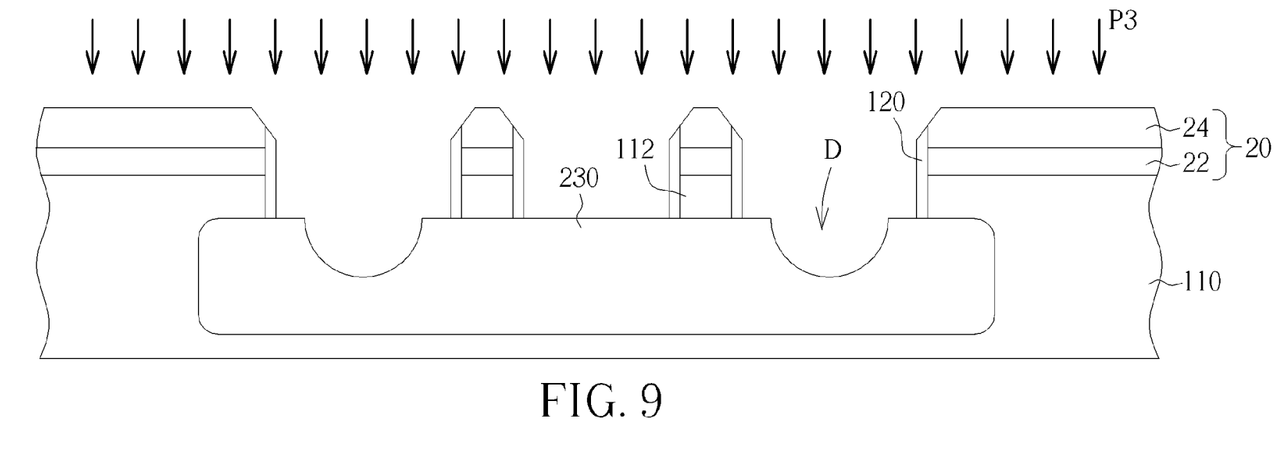
FIG. 9 schematically depicts a cross-sectional view of a multi-gate MOSFET process according to a third embodiment of the present invention.

FIG. 9 schematically depicts a cross-sectional view of a multi-gate MOSFET process according to a third embodiment of the present invention. The first several steps of the third embodiment are the same as the steps of FIGS. 1-3 of the first embodiment. In other words, the steps until forming the liner 120 and etching downward until exposing the lower part 112b of each of the fin-shaped structures 112 in the third embodiment are the same as the ones of the first embodiment. Then, as shown in FIG. 9, an oxidation process P3 is performed to form a dielectric layer 230 in the lower part 112b of each of the fin-shaped structures 112 and the substrate 110 between each of the fin-shaped structures 112. It is emphasized that, the dielectric layer 230 in the lower part 112b of each of the fin-shaped structures 112 and in the substrate 110 between each of the fin-shaped structures 112 merge together, and a bulk dielectric layer is therefore formed. This happens when the lower part 112b of each of the fin-shaped structures 112 has a short depth, the liner 120 has a thicker thickness (as shown in FIG. 3) or a large amount of oxygen gas is imported in the oxidation process P3 or etc. The bulk dielectric layer formed by the dielectric layer 230 in the lower part 112b of each of the fin-shaped structures 112 and in the substrate 110 between each of the fin-shaped structures 112 will merge together, wherein the dielectric layer 230 can protrude even more from the substrate 110 between each of the fin-shaped structures 112 than in the first embodiment. The part of the bulk dielectric layer between each of the fin-shaped structures 112 would therefore have a divot D.

The liner 120 is removed completely to expose the fin-shaped structures 112; then, an isolation structure (not shown) may be selectively formed. Alternatively, the isolation structure (not shown) may be first formed, and the liner 120 exposed from the isolation structure (not shown) is removed. Or, the isolation structure (not shown) may not be formed, and the dielectric layer 230 is used to isolate the fin-shaped structures 112 and the substrate, and each of the fin-shaped structures 112. Since the dielectric layer 230 completely electrically isolates each of the fin-shaped structures 112, whether forming the isolation structure (not shown) or not and the depth of the isolation structure (not shown) both depend upon the thickness of the gate structure disposed across the fin structures 112. Other multi-gate MOSFET processes, such as forming the gate structure, are similar to those of the first embodiment, and will not be described herein.

Figure 10:
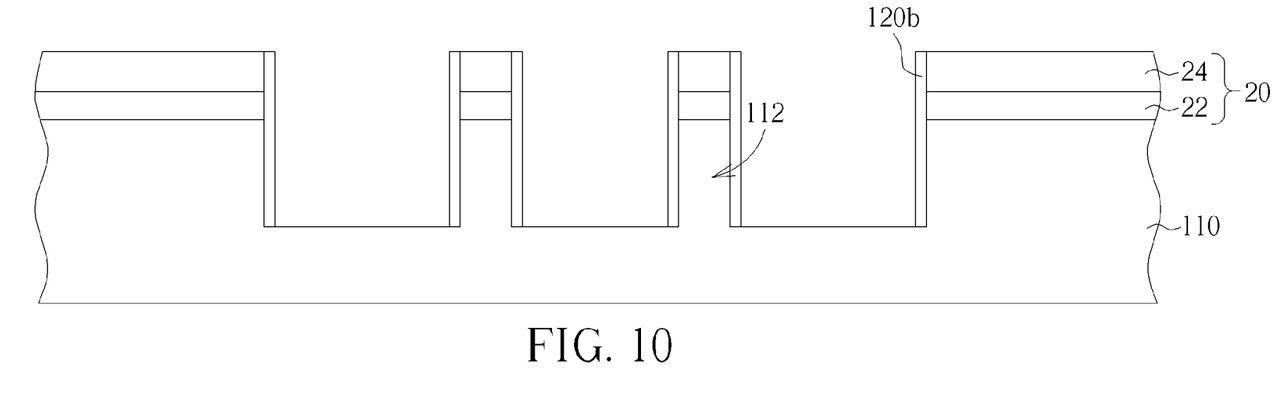
FIGS. 10-11 schematically depict cross-sectional views of a multi-gate MOSFET process according to a forth embodiment of the present invention.
Figure 11:
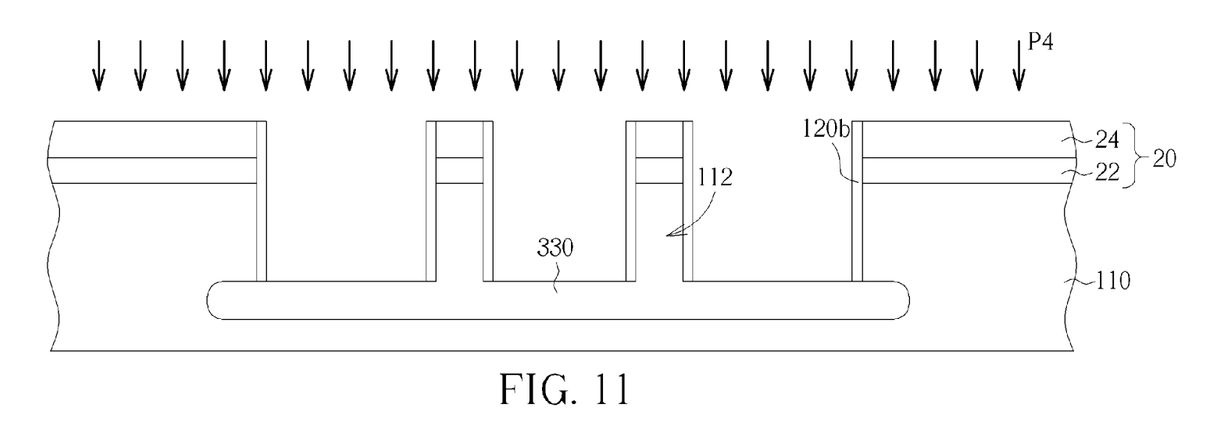

FIGS. 10-11 schematically depict cross-sectional views of a multi-gate MOSFET process according to a fourth embodiment of the present invention. The first several steps of the fourth embodiment are the same as the steps of FIGS. 1-2 of the first embodiment. In other words, the steps until forming the liner material 120' to entirely cover the upper part 112a of each of the fin-shaped structures 112, the substrate 110 and the hard mask layer 20 in the fourth embodiment are the same as the ones of the first embodiment. Then, the part of the liner material 120' on the hard mask layer 20 and on the substrate 110 between each of the fin-shaped structures 112 are removed by processes such as an etching process, so a patterned liner material 120b is formed as shown in FIG. 10. As shown in FIG. 11, an oxidation process P4 is performed to form a dielectric layer 330 right below the fin-shaped structures 112 and in the substrate 110 between each of the fin-shaped structures 112. Although the patterned liner material 120b covers the sidewalls of the fin-shaped structures 112, oxidation effects can laterally extend to the substrate below the fin-shaped structures 112 from the part of the substrate 110 being exposed. Thus, the effect of isolating each of the fin-shaped structures 112 can be achieved.

The liner material 120b may be completely removed to expose the fin-shaped structures 112; then, an isolation structure (not shown) may be selectively formed. Alternatively, the isolation structure (not shown) may be formed first, and the liner material 120b exposed from the isolation structure (not shown) is removed. Since the dielectric layer 330 completely electrically isolates each of the fin-shaped structures 112, whether forming the isolation structure (not shown) or not and the depth of the isolation structure (not shown) both depend upon the thickness of the gate structure disposed across the fin structures 112. Other multi-gate MOSFET processes, such as forming the gate structure, are similar to those of the first embodiment, and will not be described herein.

Moreover, etching processes performed twice are needed in the first embodiment, the second embodiment and the third embodiment to form the liner 120 and expose the lower part 112b of each of the fin-shaped structures 112. That includes the steps of: an etching process is performed to form the upper part 112a of each of the fin-shaped structures 112 (as shown in FIG. 1); the liner material 120' covers the entire substrate (as shown in FIG. 2); the etching process P1 is performed to form the liner 120 on the sidewalls of each of the fin-shaped structures 112 and expose the lower part 112b of each of the fin-shaped structures 112 (as shown in FIG. 3). Another embodiment is presented as following, that is used for forming the liner 120 and exposing the lower part 112b of each of the fin-shaped structures 112.

Figure 12:
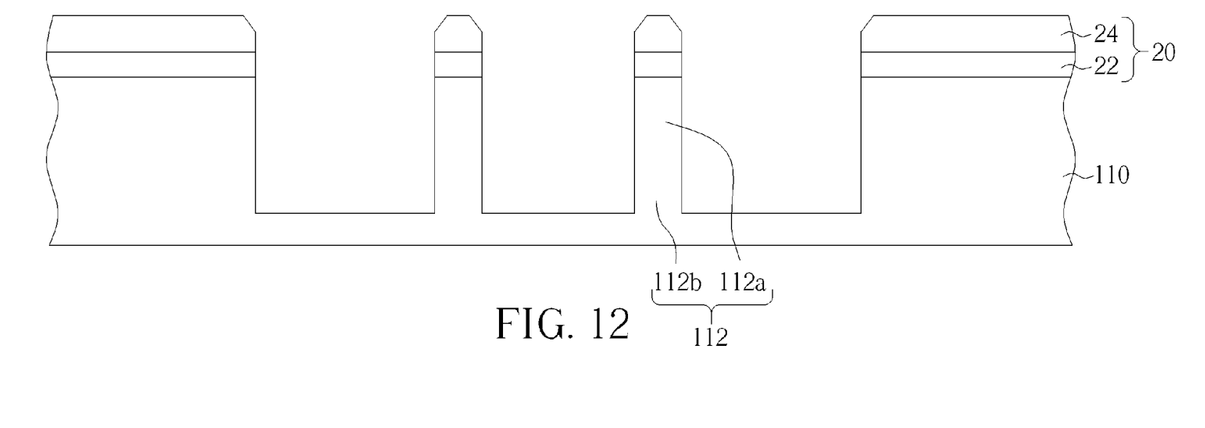
FIGS. 12-14 schematically depict cross-sectional views of a multi-gate MOSFET process according to another embodiment of the present invention.
Figure 13:
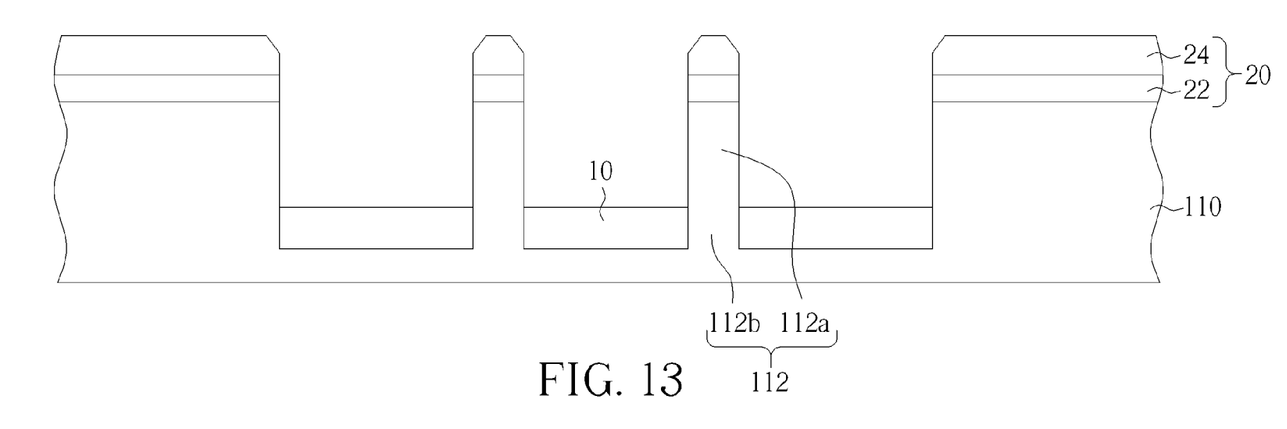
Figure 14:
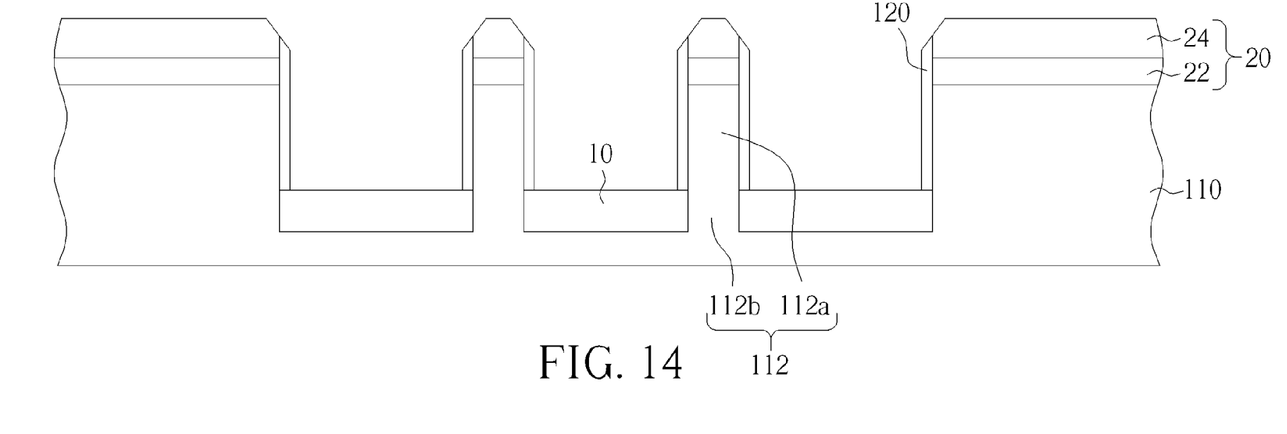

FIGS. 12-14 schematically depict cross-sectional views of a multi-gate MOSFET process according to another embodiment of the present invention. As shown in FIG. 12, the fin-shaped structures 112 are formed by performing an etching process once, wherein the fin-shaped structures 112 include the upper part 112a and the lower part 112b. As shown in FIG. 13, a filling material 10 such as ultraviolet light absorbing oxide (DUO), Advanced Patterning Film (APF) or photoresist or etc. is filled but exposing the upper part 112a of each of the fin-shaped structures 112. As shown in FIG. 14, the liner 120 is formed to cover the upper part 112a of each of the fin-shaped structures 112. In preferred embodiment, the liner 120 may be formed by performing a Chemical Vapor Deposition (CVD) process, and the processing temperature of the Chemical Vapor Deposition (CVD) process is lower than 300° C. to prevent the organic materials such as ultraviolet light absorbing oxide, (DUO), Advanced Patterning Film (APF) or photoresist from polluting process equipments. Then, the filling material 10 is removed, so that the structure of FIG. 3 can be obtained, and later processes of the present invention can be performed.

To summarize, the present invention provides a multi-gate MOSFET and a process thereof, which forms a liner on the sidewalls of a part of the fin-shaped structure, and then oxidizes a part of the fin-shaped structure not covered by the liner and a part of a substrate between each of the fin-shaped structures, so that an oxide layer can be formed in the lower part of the fin-shaped structure or in the substrate below the fin-shaped structure, and the substrate between each of the fin-shaped structures. Four embodiments, which can form oxide layers, bulk oxide layers with slightly different structures, are presented in the present invention, but the present invention is not restricted to these. In these ways, each of the fin-shaped structures can be electrically isolated from each other and each of the fin-shaped structures can be electrically isolated from the substrate by oxidizing the lower part of each of the fin-shaped structures or the substrate below each of the fin-shaped structures, and the substrate between each of the fin-shaped structures. This way, transistors formed on each of the fin-shaped structures can be electrically isolated from each other, and circuit leakage flowing downward from the transistors to the substrate can be prevented.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A multi-gate MOSFET, comprising:
    a substrate having a first area and a second area;
    a dielectric layer being a single layer only located in the substrate in the first area;
    at least a fin-shaped structure located on the dielectric layer, wherein a part of the dielectric layer directly below the fin-shaped structure protrudes from a part of the dielectric layer beside the fin-shaped structure;
    a liner located only on a part of sidewalls of the fin-shaped structure without contacting the dielectric layer; and
    an isolation structure located on the dielectric layer and surrounding the fin-shaped structure, wherein a top surface of the liner is trimmed with a top surface of the isolation structure, wherein the isolation structure and the dielectric layer have an interface between them.

2. The multi-gate MOSFET according to claim 1, wherein the dielectric layer is located between the fin-shaped structure and the substrate, and the fin-shaped structure and the substrate sandwich the dielectric layer from top and bottom.

3. The multi-gate MOSFET according to claim 1, wherein the fin-shaped structure has an upper part and a lower part, and the upper part comprises a silicon structure and the lower part comprises a dielectric structure.

4. The multi-gate MOSFET according to claim 1, wherein the substrate surrounds the dielectric layer.

5. The multi-gate MOSFET according to claim 1, wherein a bottom surface of the liner is level with a top surface of the dielectric layer.

6. The multi-gate MOSFET according to claim 1, further comprising:
    a gate structure disposed across the fin-shaped structure, and a source and a drain are located in the fin-shaped structure and are respectively located on both sides of the gate structure.

7. A multi-gate MOSFET, comprising:
    a substrate having a first area and a second area;
    a dielectric layer only located in the substrate in the first area;
    a plurality of fin-shaped structures located on the dielectric layer, wherein the dielectric layer is located directly below said plurality of fin-shaped structures and located in the substrate between the plurality of fin-shaped structures;
    liners located only on parts of sidewalls of the plurality of fin-shaped structures; and
    an isolation structure located on the dielectric layer and surrounding the plurality of fin-shaped structures, wherein top surfaces of the liners are trimmed with a top surface of the isolation structure, and an entirety of the dielectric layer is below the isolation structure and the liners, wherein the isolation structure and the dielectric layer have an interface between them.

* * * * *